(12) United States Patent
Das et al.

(10) Patent No.: US 8,866,150 B2
(45) Date of Patent: Oct. 21, 2014

(54) SILICON CARBIDE POWER DEVICES INCLUDING P-TYPE EPITAXIAL LAYERS AND DIRECT OHMIC CONTACTS

(75) Inventors: Mrinal Kanti Das, Durham, NC (US); Qingchun Zhang, Cary, NC (US); John M. Clayton, Jr., Apex, NC (US); Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 2030 days.

(21) Appl. No.: 11/756,020

(22) Filed: May 31, 2007

(65) Prior Publication Data

US 2008/0296771 A1    Dec. 4, 2008

(51) Int. Cl.
| | |
|---|---|
| *H01L 29/15* | (2006.01) |
| *H01L 23/482* | (2006.01) |
| *H01L 29/739* | (2006.01) |
| *H01L 29/66* | (2006.01) |
| *H01L 29/10* | (2006.01) |
| *H01L 21/04* | (2006.01) |
| *H01L 21/268* | (2006.01) |

(52) U.S. Cl.
CPC . *H01L 29/66068* (2013.01); *H01L 2924/13055* (2013.01); *H01L 2924/01013* (2013.01); *H01L 2924/01006* (2013.01); *H01L 2924/01078* (2013.01); *H01L 2924/01022* (2013.01); *H01L 2224/04026* (2013.01); *H01L 2924/01033* (2013.01); *H01L 21/268* (2013.01); *H01L 23/4827* (2013.01); *H01L 29/7395* (2013.01); *H01L 29/1095* (2013.01); *H01L 2924/01005* (2013.01); *H01L 2924/01079* (2013.01); *H01L 2924/01014* (2013.01); *H01L 21/0475* (2013.01); *H01L 21/0485* (2013.01); *H01L 2924/13091* (2013.01); *H01L 2924/10271* (2013.01)
USPC .......................................................... 257/77

(58) Field of Classification Search
USPC .................. 257/758, 341, E29.297–E29.298, 257/552–562, E29.033, 47, 77, 288, 289, 257/472, 618, E29.026, E29.07, E29.104, 257/E29.106, E29.254; 438/235–238
See application file for complete search history.

(56) References Cited

U.S. PATENT DOCUMENTS

| | | |
|---|---|---|
| 5,539,217 A | 7/1996 | Edmond et al. |
| 6,475,889 B1 | 11/2002 | Ring |

(Continued)

FOREIGN PATENT DOCUMENTS

| | | | |
|---|---|---|---|
| FR | WO 2004/020706 | * | 3/2004 |
| JP | 9-102604 A | | 4/1997 |

(Continued)

OTHER PUBLICATIONS

Notification of Transmittal of the International Search Report and the Written Opinion of the International Searching Authority, or the Declaration; International Search Report; Written Opinion of the International Searching Authority, PCT/US2008/004239, Mar. 2, 2009.

(Continued)

*Primary Examiner* — Dao H Nguyen
*Assistant Examiner* — Tram H Nguyen
(74) *Attorney, Agent, or Firm* — Myers Bigel Sibley & Sajovec, P.A

(57) ABSTRACT

A silicon carbide power device is fabricated by forming a p-type silicon carbide epitaxial layer on an n-type silicon carbide substrate, and forming a silicon carbide power device structure on the p-type silicon carbide epitaxial layer. The n-type silicon carbide substrate is at least partially removed, so as to expose the p-type silicon carbide epitaxial layer. An ohmic contact is formed on at least some of the p-type silicon carbide epitaxial layer that is exposed. By at least partially removing the n-type silicon carbide substrate and forming an ohmic contact on the p-type silicon carbide epitaxial layer, the disadvantages of using a p-type substrate may be reduced or eliminated. Related structures are also described.

14 Claims, 14 Drawing Sheets

(56) References Cited

U.S. PATENT DOCUMENTS

| | | | |
|---|---|---|---|
| 6,515,303 | B2 | 2/2003 | Ring |
| 6,649,497 | B2 | 11/2003 | Ring |
| 6,946,739 | B2 | 9/2005 | Ring |
| 6,956,238 | B2 | 10/2005 | Ryu et al. |
| 6,979,863 | B2 | 12/2005 | Ryu |
| 7,026,650 | B2 | 4/2006 | Ryu et al. |
| 7,074,643 | B2 | 7/2006 | Ryu |
| 7,118,970 | B2 | 10/2006 | Das et al. |
| 7,125,786 | B2 | 10/2006 | Ring et al. |
| 2004/0016929 | A1* | 1/2004 | Nakatsuka et al. ............ 257/77 |
| 2004/0082116 | A1* | 4/2004 | Kub et al. .................... 438/137 |
| 2004/0211980 | A1* | 10/2004 | Ryu ............................. 257/200 |
| 2005/0104072 | A1 | 5/2005 | Slater, Jr. et al. |
| 2005/0151138 | A1 | 7/2005 | Slater, Jr. et al. |
| 2006/0211210 | A1 | 9/2006 | Bhat et al. |
| 2006/0261347 | A1 | 11/2006 | Ryu et al. |
| 2006/0267021 | A1 | 11/2006 | Rowland et al. |
| 2007/0066039 | A1 | 3/2007 | Agarwal et al. |

FOREIGN PATENT DOCUMENTS

| | | |
|---|---|---|
| JP | 2004-103763 A | 4/2004 |
| JP | 2005-175174 A | 6/2005 |
| JP | 2006-156658 A | 6/2006 |
| JP | 2009-509339 A | 3/2009 |
| WO | WO 2004/020706 A1 | 3/2004 |
| WO | WO 2005/020308 A1 | 3/2005 |
| WO | WO 2007/035333 A1 | 3/2007 |

OTHER PUBLICATIONS

Baliga "Power MOSFET" *Power Semiconductor Devices*. PWS Publishing Company, Boston, MA. 335-425 (1996).

Baliga "Insulated Gate Bipolar Transistor" *Power Semiconductor Devices*. PWS Publishing Company, Boston, MA. 426-502 (1996).

Bhatnagar et al. "Comparison of 6H-SiC, 3C-SiC, and Si for Power Devices" *IEEE Transactions on Electron Devices* 40(3):645-655 (1993).

Streetman "Bipolar Junction Transistors" *Solid State Electronic Devices* Prentice Hall, Englewood Cliffs, NJ. 228-284 (1980).

U.S. Appl. No. 11/740,687, filed Apr. 26, 2007, Das et al.

"Insulated-gate bipolar transistor." *Wikipedia, the Free Encyclopedia*. Web. Jun. 21, 2010. http://en.wikipedia.org.

Japanese Office Action Corresponding to Japanese Patent Application No. 2010-510279; Date of Mailing: Dec. 14, 2012; Foreign Text, 4 Pages.

Communication pursuant to Article 94(3) EPC, European Patent Application No. 08 825 948.6, May 6, 2014, 5 pp.

* cited by examiner ns in the invention.

SILICON CARBIDE POWER DEVICES INCLUDING P-TYPE EPITAXIAL LAYERS AND DIRECT OHMIC CONTACTS

STATEMENT OF U.S. GOVERNMENT INTEREST

This invention was made with Government support under Contract No. N00014-05-C-0202 awarded by ONR/DARPA. The Government may have certain rights in the invention.

FIELD OF THE INVENTION

This invention relates to methods of fabricating power devices and the resulting devices, and more particularly to silicon carbide power devices and methods of fabricating silicon carbide power devices.

BACKGROUND OF THE INVENTION

Power devices are widely used to carry large currents and support high voltages. Modern power devices are often fabricated from monocrystalline silicon semiconductor material. One widely used power device is the power Metal Oxide Semiconductor Field Effect Transistor (MOSFET). In a power MOSFET, a control signal is supplied to a gate electrode that is separated from the semiconductor surface by an intervening insulator, which may be, but is not limited to, silicon dioxide. Current conduction occurs via transport of majority carriers, without the presence of minority carrier injection that is used in bipolar transistor operation. Power MOSFETs can provide an excellent safe operating area, and can be paralleled in a unit cell structure.

As is well known to those having skill in the art, power MOSFETs may include a lateral structure or a vertical structure. In a lateral structure, the drain, gate and source terminals are on the same surface of a substrate. In contrast, in a vertical structure, the source and drain are on opposite surfaces of the substrate.

One widely used silicon power MOSFET is the double diffused MOSFET (DMOSFET) which is fabricated using a double-diffusion process. In these devices, a p-base region and an n+ source region are diffused through a common opening in a mask. The p-base region is driven in deeper than the n+ source. The difference in the lateral diffusion between the p-base and n+ source regions forms a surface channel region. An overview of power MOSFETs including DMOSFETs may be found in the textbook entitled "Power Semiconductor Devices" by B. J. Baliga, published by PWS Publishing Company, 1996, and specifically in Chapter 7, entitled "Power MOSFET", the disclosure of which is hereby incorporated herein by reference in its entirety as if set forth fully herein.

Another type of widely used power device is the Bipolar Junction Transistor (BJT). A BJT typically includes a semiconductor material having two opposing p-n junctions in close proximity to one another; thus, BJTs may be referred to as "n-p-n" or "p-n-p" transistors. In operation, current carriers enter a region of the semiconductor material of a first conductivity type adjacent one of the p-n junctions, which is called the emitter. Most of the charge carriers exit the device from a region of the semiconductor material of the first conductivity type adjacent the other p-n junction, which is called the collector. A small portion of semiconductor material known as the base, having a second conductivity type, opposite the first conductivity type of the collector and the emitter, is positioned between the collector and the emitter. The two p-n junctions of the BJT are formed where the collector meets the base and where the base meets the emitter.

When current is injected into or extracted from the base, depending upon whether the BJT is n-p-n or p-n-p, the flow of charge carriers, i. e., electrons or holes, which can move from the emitter to the collector, may be affected. Typically, small currents applied to the base can control proportionally larger currents passing through the BJT, giving it usefulness as a component of electronic circuits. Structural and operational details of BJT's are discussed in Solid State Electronic Devices by B. Streetman (2nd edition (1980), chapter 7), the content of which is incorporated herein by reference as if set forth in its entirety.

Insulated Gate Bipolar Transistors (IGBTs) are yet another type of power device that can combine the drive gate characteristics of the power MOSFET with the high current and low saturation voltage of BJTs by combining a power MOSFET for the control input and a bipolar power transistor as a switch, in a single device. An overview of IGBTs may be found in the above-cited textbook entitled "Power Semiconductor Devices" and specifically in Chapter 8, entitled "Insulated Gate Bipolar Transistor", the disclosure of which is hereby incorporated herein by reference in its entirety as if set forth fully herein.

Recent development efforts in power devices have also included investigation of the use of silicon carbide (SiC) devices for power devices. Silicon carbide has a wide bandgap, a lower dielectric constant, a high breakdown field strength, a high thermal conductivity, and a high saturation electron drift velocity compared to silicon. These characteristics may allow silicon carbide power devices to operate at higher temperatures, higher power levels and/or with lower specific on-resistance than conventional silicon-based power devices. A theoretical analysis of the superiority of silicon carbide devices over silicon devices is found in a publication by Bhatnagar et al. entitled "*Comparison of 6H-SiC, 3C-SiC and Si for Power Devices*", IEEE Transactions on Electron Devices, Vol. 40, 1993, pp. 645 655. A power MOSFET fabricated in silicon carbide is described in U.S. Pat. No. 5,506,421 to Palmour entitled "Power MOSFET in Silicon Carbide" and assigned to the assignee of the present invention. Other power devices fabricated in silicon carbide are described in U.S. Pat. Nos. 7,118,970; 7,074,643; 7,026,650; 6,979,863 and 6,956,238.

Silicon carbide IGBTs may be highly desirable when very high blocking voltages are desirable. In particular, because the on-resistance of a unipolar power device such as a DMOSFET generally increases by the square of the blocking voltage, it may be desirable to provide IGBT devices at very high blocking voltages. For silicon carbide devices, this transition point may occur at about 10 kV when considering both conduction and switching losses. As is well known to those having skill in the art, a unipolar device such as a DMOSFET may be converted to a bipolar device, such as an IGBT by adding a junction between the substrate and the epitaxial drift region. For example, a unipolar n-channel DMOSFET structure can become bipolar when the substrate is switched from n-type to p-type. The p-n junction so formed is forward biased in the on-state, and injects minority carriers into the lightly doped drift region, to increase its conductivity, a phenomenon known as "conductivity modulation". Thus, a p-channel IGBT may be fabricated on n-type substrates of, for example, 4H silicon carbide, to provide a p-n junction between the n-type substrate and the p-type drift region.

It may also be desirable to provide an n-channel IGBT, because this device could provide lower on-resistance and/or higher blocking voltage than its p-channel counterpart. Moreover, n-channel devices, with their positive voltage polarities and similarities to conventional power MOSFETs, may be more attractive from a systems point of view. Unfortunately, 4H silicon carbide p-type substrates that would be used to fabricate n-channel IGBTs generally lack both the quality and conductivity to work well in an IGBT.

SUMMARY OF THE INVENTION

Some embodiments of the invention fabricate a silicon carbide power device by forming a p-type silicon carbide epitaxial layer on an n-type silicon carbide substrate, and forming a silicon carbide power device structure on the p-type silicon carbide epitaxial layer. The n-type silicon carbide substrate is at least partially removed, so as to expose the p-type silicon carbide epitaxial layer. An ohmic contact is formed on at least some of the p-type silicon carbide epitaxial layer that is exposed. Accordingly, by at least partially removing the n-type silicon carbide substrate and forming an ohmic contact on the p-type silicon carbide epitaxial layer, the potential disadvantages of using a p-type substrate may be reduced or eliminated.

Many techniques may be used to at least partially remove the n-type silicon carbide substrate, so as to expose the p-type silicon carbide epitaxial layer. For example, in some embodiments, at least one via is etched through the n-type silicon carbide substrate, so as to expose the p-type silicon carbide epitaxial layer in the via. An ohmic contact is then formed in the at least one via. In other embodiments, the entire n-type silicon carbide substrate is removed. In still other embodiments, the n-type silicon carbide substrate may be thinned and then at least one via may be etched through the thinned n-type silicon carbide substrate.

In some embodiments, prior to removing the entire n-type silicon carbide substrate, thinning the n-type silicon carbide substrate and/or etching vias, the silicon carbide power device is bonded to a carrier substrate. After removing the entire n-type silicon carbide substrate, thinning the n-type silicon carbide substrate and/or etching vias, the silicon carbide power device structure may then be debonded from the carrier substrate.

Many techniques may be used to form the ohmic contact on at least some of the p-type silicon carbide epitaxial layer that is exposed. In some embodiments, at least some of the p-type silicon carbide epitaxial layer that is exposed is metallized, and then at least some of the metallization is laser annealed. In other embodiments, metallizing may be performed by sequentially forming a first layer comprising aluminum, a second layer comprising titanium, and a third layer comprising nickel on at least some of the p-type silicon carbide epitaxial layer that is exposed. In still other embodiments, a single layer comprising aluminum may be provided and laser annealed.

Various types of silicon carbide power device structure may be formed on the p-type silicon carbide epitaxial layer according to various embodiments of the present invention. For example, in some embodiments, a p-type silicon carbide power device (for example, a p-channel or p-base device) may be formed on the p-type silicon carbide epitaxial layer. In other embodiments, an n-type silicon carbide power device (for example, an n-channel or n-base device) is formed on the p-type silicon carbide epitaxial layer by epitaxially forming an n-type silicon carbide layer directly on the p-type epitaxial silicon carbide layer, so as to form a p-n junction therebetween.

In yet other embodiments of the invention, the silicon carbide power device structure that is formed on the p-type silicon carbide epitaxial layer is an n-channel silicon carbide DMOSFET, such that the n-channel silicon carbide DMOSFET and the p-type silicon carbide epitaxial layer provide an n-channel silicon carbide IGBT. In some embodiments of this n-channel IGBT fabrication process, the DMOSFET may be fabricated on the p-type silicon carbide epitaxial layer prior to at least partially removing the n-type silicon carbide substrate. In these embodiments, the n-type silicon carbide substrate is at least partially removed and the ohmic contact may be formed using the three-layer structure that was described above and by laser annealing. Moreover, the bonding and debonding of a carrier substrate as described above may also be used. However, in other embodiments, at least partially removing the n-type silicon carbide substrate so as to expose the p-type silicon carbide epitaxial layer may be performed during and/or prior to forming the silicon carbide power device structure on the p-type silicon carbide epitaxial layer.

Silicon carbide power devices according to some embodiments of the present invention comprise a p-type silicon carbide epitaxial layer including first and second opposing faces. A silicon carbide power device structure is on the second face of the p-type silicon carbide epitaxial layer. An ohmic contact is directly on at least a portion of the first face of the p-type silicon carbide epitaxial layer. In some embodiments, an n-type silicon carbide substrate also is on the first face, including at least one via that extends therethrough, so as to expose at least a portion of the first face of the p-type silicon carbide layer. In these embodiments, the ohmic contact extends in the at least one via and directly on at least a portion of the p-type silicon carbide layer that is exposed. The ohmic contact may comprise a metal contact and may include laser annealed portions thereof. A single layer contact or a three-layer contact as described above also may be provided.

In some embodiments, the silicon carbide power device structure comprises an n-channel silicon carbide DMOSFET structure directly on the second face of the p-type silicon carbide epitaxial layer, such that the n-channel silicon carbide DMOSFET structure and the p-type silicon carbide epitaxial layer provide an n-channel silicon carbide IGBT structure. However, in other embodiments, other n-type or p-type silicon carbide power device structures may be provided on the p-type silicon carbide epitaxial layer. In still other embodiments, the silicon carbide power device structure comprises an n-type silicon carbide epitaxial layer directly on the second face of the p-type epitaxial silicon carbide layer, so as to form a p-n junction therebetween.

DETAILED DESCRIPTION

Figure 1:
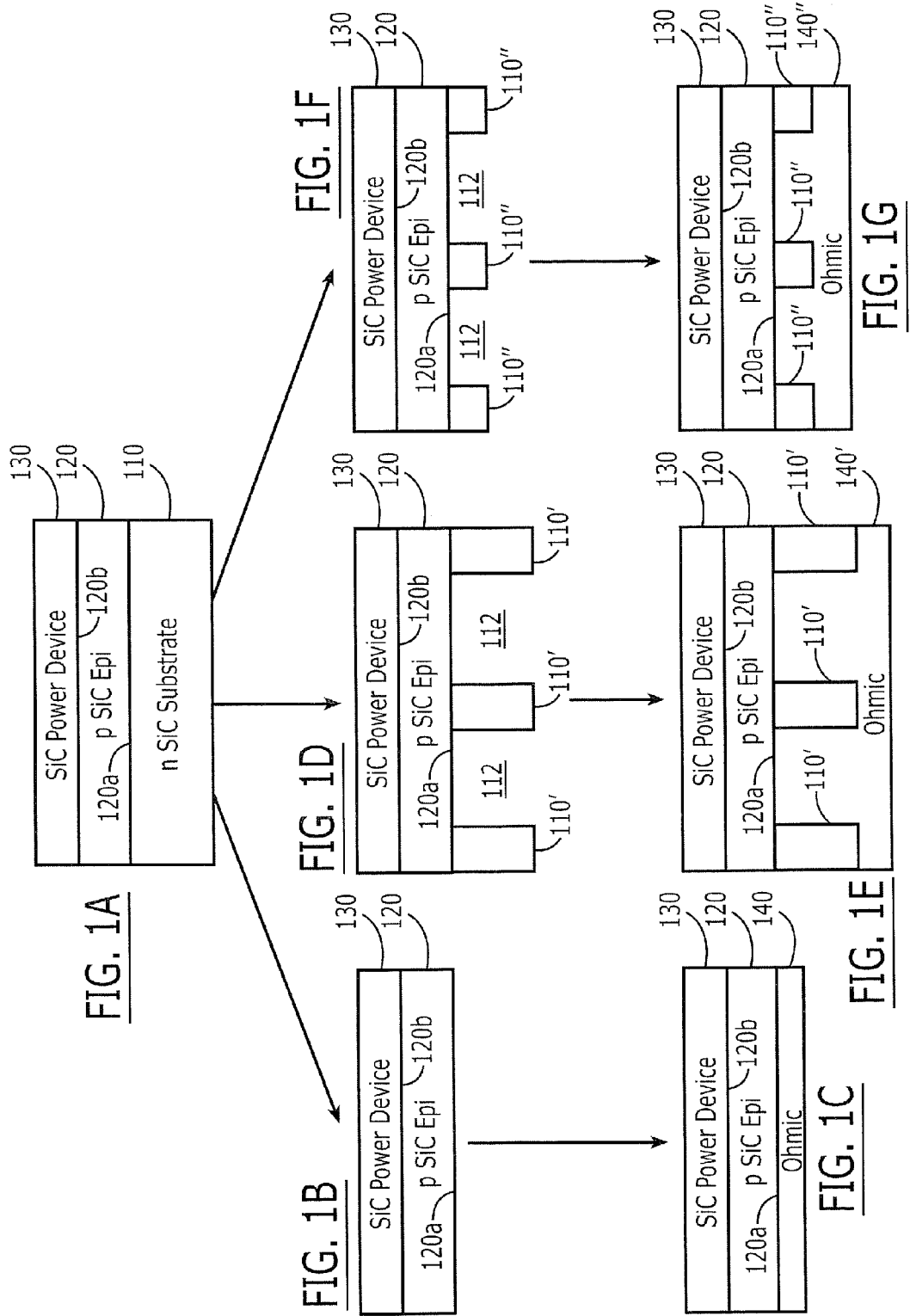
FIGS. 1A-1G, 2A-2G, 3A-3G, 4A-4G and 5A-5G are cross-sectional views of silicon carbide power devices according to various embodiments of the present invention during intermediate fabrication steps according to various embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof. In contrast, the term "consisting of" when used in this specification, specifies the stated features, integers, steps, operations, elements, and/or components, and precludes additional features, integers, steps, operations, elements and/or components. Moreover, the term "consisting essentially of" when used in the specification, specifies the stated number of features, integers, steps, operations, elements and/or components, and precludes additional features, integers, steps, operations, elements and/or components, except for insubstantial amounts of impurities or other materials that do not materially affect the basic and novel characteristics of the stated features, integers, steps, operations, elements and/or components.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

FIGS. 1A-1G are cross-sectional views of methods of fabricating silicon carbide power devices according to various embodiments of the present invention and silicon carbide power devices fabricated according to various embodiments of the present invention. Referring now to FIG. 1A, a p-type silicon carbide epitaxial layer 120 is formed on an n-type silicon carbide substrate 110. The n-type silicon carbide substrate may be a 4H silicon carbide n-type substrate in some embodiments. However, in other embodiments, other silicon carbide polytypes may be used. The p-type silicon carbide epitaxial layer 120 may have various thicknesses and doping levels depending on the desired design. A silicon carbide power device structure 130 is fabricated on a second face 120b of the p-type silicon carbide epitaxial layer 120 opposite a first face 120a of the silicon carbide epitaxial layer 120 that is adjacent the n-type silicon carbide substrate 110. It will be understood that the term "silicon carbide power device structure" is used herein to indicate that a precursor to a complete silicon carbide power device or a complete silicon carbide power device itself may be formed. Silicon carbide power devices may include, but are not limited to, silicon carbide Schottky diodes, MOSFETs, BJTs, PiN diodes, IGBTs, thyristors and/or vertical JFETs. The design and fabrication of n-type silicon carbide substrates 110, p-type silicon carbide epitaxial layers and silicon carbide power device structures 130 are well known to those having skill in the art and need not be described further herein.

Referring now to FIGS. 1B, 1D and 1F, the n-type silicon carbide substrate 110 of FIG. 1A is at least partially removed, so as to expose the first face 120a of the p-type silicon carbide epitaxial layer 120. Many techniques may be used to at least partially remove the n-type silicon carbide substrate 110, so as to expose the p-type silicon carbide epitaxial layer 120. In particular, in FIG. 1B, the entire n-type silicon carbide substrate is removed. In FIG. 1D, at least one via 112 is etched through the n-type silicon carbide substrate 110, so as to expose the p-type silicon carbide epitaxial layer 120 in the via 112. Alternatively, in FIG. 1F, the n-type silicon carbide substrate 110 is thinned and then at least one via 112 is etched through the n-type silicon carbide substrate 110" that has been thinned, so as to expose the p-type silicon carbide epitaxial layer 120 in the via 112. Techniques for at least partially removing a silicon carbide substrate by grinding and/or etching are described in U.S. Pat. Nos. 7,125,786; 6,946,739; 6,649,497; 6,515,303 and 6,475,889; and in U.S. Patent Application Publications US 2005/0151138 and 2007/0066039, the disclosures of which are hereby incorporated herein by reference in their entirety as if set forth fully herein, and need not be described further herein.

Referring now to FIGS. 1C, 1E and 1G, an ohmic contact is formed on at least some of the p-type silicon carbide epitaxial layer 120 that is exposed. For example, in FIG. 1C, an ohmic contact 140 is formed directly on the exposed first face 120a of the p-type silicon carbide epitaxial layer. In FIG. 1E, an ohmic contact 140' is formed in the vias 112 that were formed in the etched n-type silicon carbide substrate 110'. Finally, in FIG. 1G, an ohmic contact 140" is formed in the vias of the etched and thinned n-type silicon carbide substrate 110". In FIGS. 1E and 1G, the ohmic contact 140' and 140" may extend beyond the vias as shown. In some embodiments, the ohmic contact may be formed by metallizing at least some of the p-type silicon carbide epitaxial layer 120 that is exposed.

Figure 2:
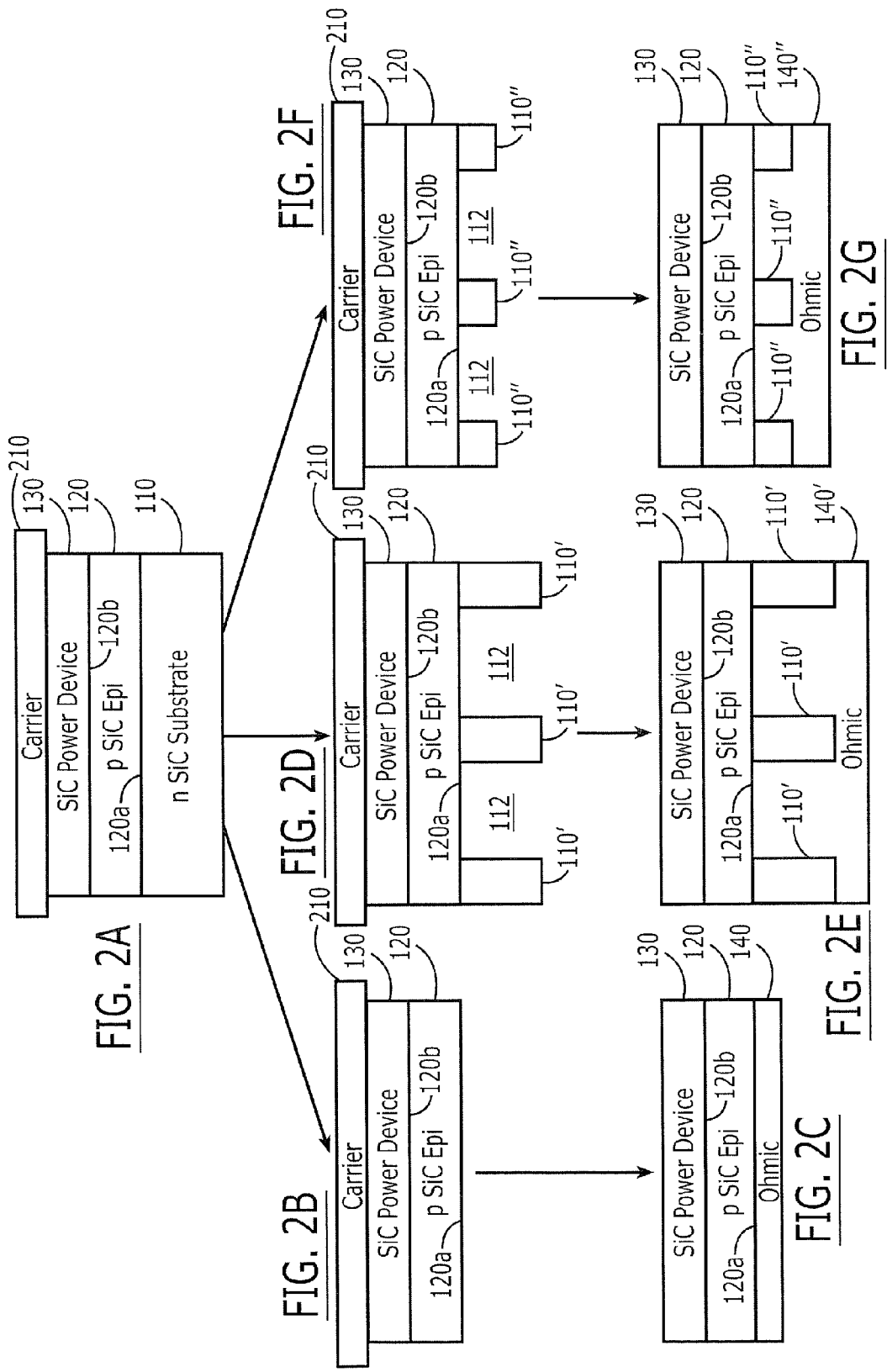
Figure 3:
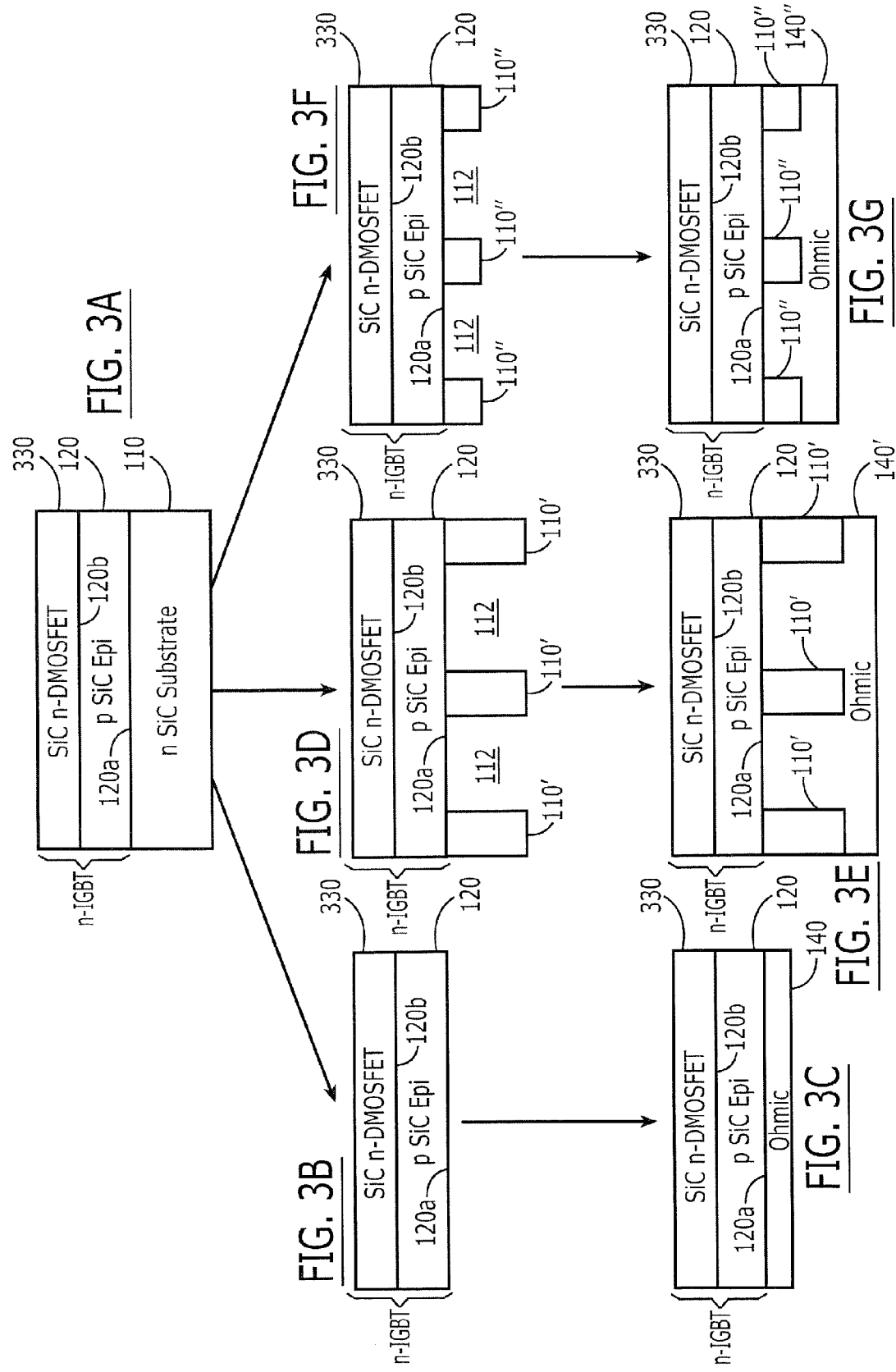
Figure 4:
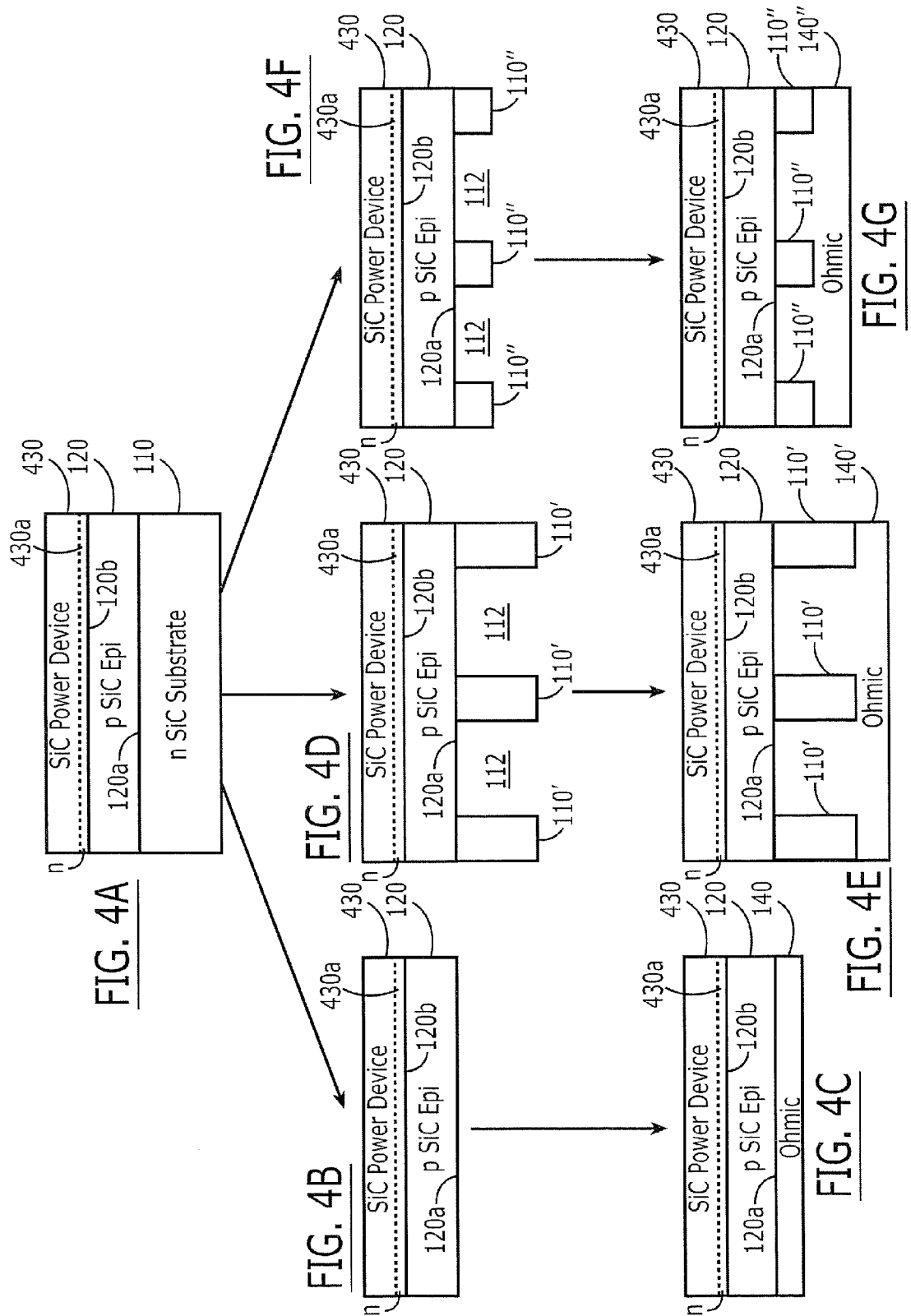
Figure 5:
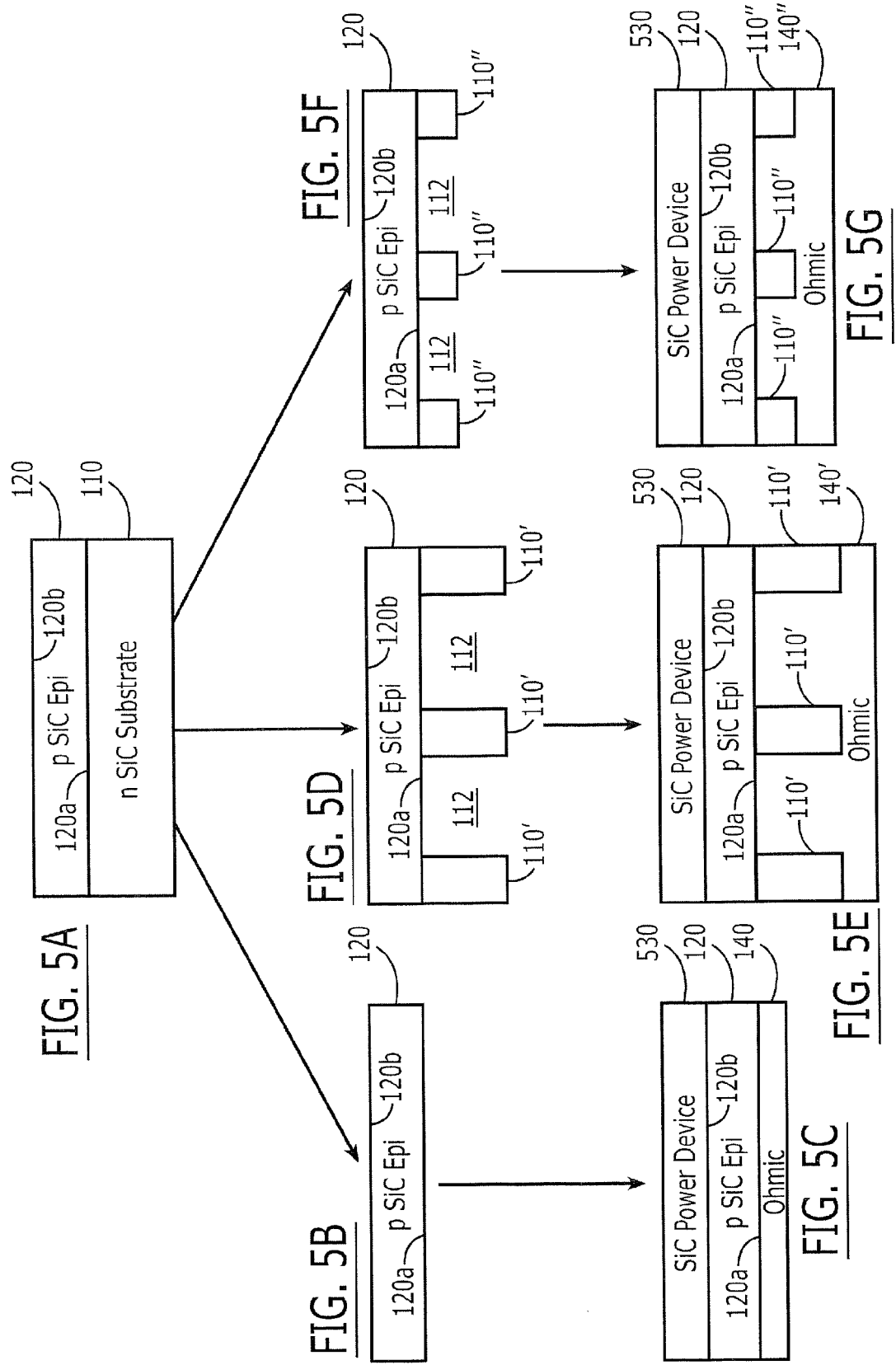

FIGS. 2A-2G are cross-sectional views of methods and structures according to other embodiments of the present invention. FIGS. 2A-2G correspond to FIGS. 1A-1G, except that the silicon carbide power device structure 130 is bonded to a carrier substrate, such as a glass and/or sapphire substrate 210 prior to at least partially removing the n-type silicon carbide substrate, as illustrated in FIGS. 2B, 2D and 2F. The carrier substrate 210 may be used to provide rigidity and/or to facilitate handling of the device during and/or after the at least partial removal of the n-type silicon carbide substrate 110. After at least partial substrate removal, as illustrated in FIGS. 2B, 2D and 2F, carrier substrate 210 may be debonded, as illustrated in FIGS. 2C, 2E and 2G. In other embodiments, debonding may occur after the entire device is completed or at other steps in the process after at least partial removal of the n-type silicon carbide substrate 110.

FIGS. 3A-3G are cross-sectional views of methods of fabricating silicon carbide power devices according to other embodiments of the present invention and silicon carbide power devices so fabricated according to other embodiments of the present invention. In particular, in FIGS. 3A-3G, the silicon carbide power device structure comprises a silicon carbide MOSFET structure and, in some embodiments, an n-channel silicon carbide DMOSFET structure 330. As is well known to those having skill in the art, a DMOSFET structure includes an n-type drift region or other n-type region as the drain thereof. As such, the p-type silicon carbide epitaxial layer 120 forms a p-n junction, and the combination of the n-channel silicon carbide DMOSFET structure 330 and the p-type silicon carbide epitaxial layer 120 provides an n-channel silicon carbide IGBT structure. In still other embodiments of FIGS. 3A-3G, a carrier substrate may be used as was described in FIGS. 2A-2G. A description of these embodiments will not be repeated for the sake of brevity. In an n-channel IGBT, the p-type silicon carbide epitaxial layer 120 may also be referred to as an "injector" layer. As is well known to those having skill in the art, the injector layer 120 forms a p-n junction with the n- drain structure (drift region and/or buffer layer) of the DMOSFET 330, which is forward biased in the on-state and injects minority carriers into the lightly doped drift region to increase its conductivity, a phenomena known as "conductivity modulation".

FIGS. 4A-4G are cross-sectional views of methods of fabricating silicon carbide power devices according to still other embodiments of the present invention and silicon carbide power devices fabricated according to still other embodiments of the present invention. In FIGS. 4A-4G, as part of the process of forming a silicon carbide power device 430, an n-type silicon carbide layer 430a is formed directly on the p-type epitaxial silicon carbide layer 120, so as to form a p-n junction therebetween. The n-type silicon carbide layer 430a may function as a drift region, a buffer layer and/or other conventional n-type layer of, for example, an n-channel or a p-channel power MOSFET or other n-type or p-type silicon carbide power device structure 430. A carrier substrate also may be used as was described above in connection with FIGS. 2A-2G, but a description thereof will not be repeated for the sake of brevity.

FIGS. 5A-5G are cross-sectional views of methods of fabricating silicon carbide power devices according to still other embodiments of the present invention and silicon carbide power devices fabricated according to still other embodiments of the present invention. FIGS. 5A-5G may be contrasted with FIGS. 1A-1G through 4A-4G in that the silicon carbide power device 530 is not epitaxially formed on the p-type silicon carbide epitaxial layer 120 until after the n-type silicon carbide substrate 110 is at least partially removed in FIGS. 5B, 5D and 5F. Analogous embodiments to FIGS. 2A-2G through 4A-4G also may be provided, wherein the silicon carbide power device 530 is formed after at least partial removal of the silicon carbide substrate 110. It will also be understood by those having skill in the art that FIGS. 1A-1G and 5A-5G illustrate two extremes. In particular, in FIGS. 1A-1G, the power device structure is formed prior to substrate removal, whereas in FIGS. 5A-5G, the power device structure is formed after substrate removal. In other embodiments, the silicon carbide power device structure may be partially formed before substrate removal and then completed after substrate removal. Stated differently, at least partially removing the n-type silicon carbide substrate may be performed prior, after and/or during the forming of the silicon carbide power device structure on the p-type silicon carbide epitaxial layer.

Figure 6:
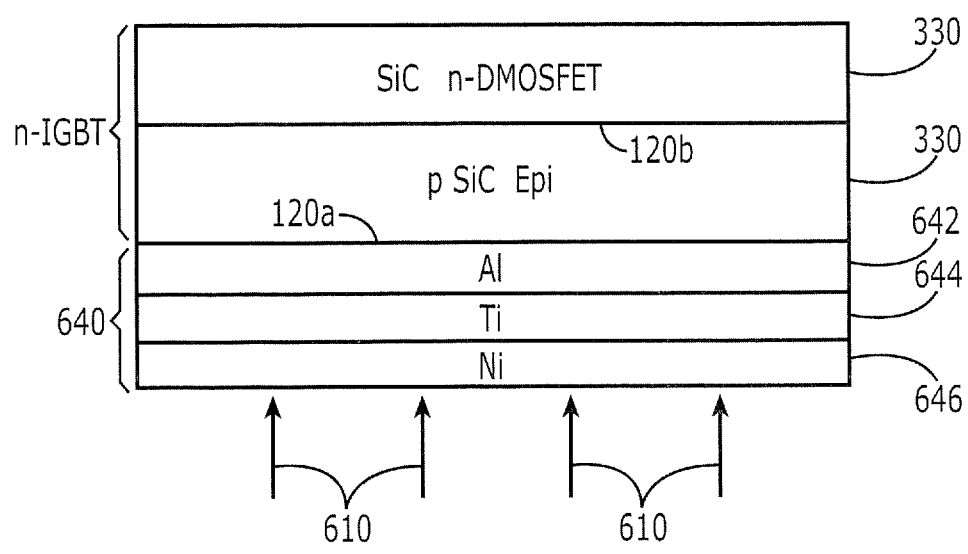
FIG. 6 is a cross-sectional view of a silicon carbide power device according to various embodiments of the present invention illustrating back side ohmic contacts and methods of fabricating same according to various embodiments of the present invention.

FIG. 6 is a cross-sectional view of methods of fabricating silicon carbide power devices according to various embodiments of the present invention and silicon carbide devices so fabricated. FIG. 6 corresponds to FIG. 3C, except that additional details of the ohmic contact 640, which may correspond to the ohmic contact 140 of FIG. 3C, are illustrated. In particular, in FIG. 6, a multilayer ohmic contact 640 is provided that includes a first layer 642 comprising aluminum (Al), a second layer 644 comprising titanium (Ti) and a third layer 646 comprising nickel (Ni). In some embodiments, the first layer consists essentially of aluminum and may have a thickness of about 200 Å, the second layer 644 consists essentially of titanium and may have a thickness of about 100 Å, and the third layer 646 consists essentially of nickel and may have a thickness of about 400 Å.

Moreover, as also shown in FIG. 6, after the three-layer Al/Ti/Ni stack 640 is deposited, a laser anneal may be performed for the ohmic contact. A laser anneal may be performed by scanning a laser beam 610 over the ohmic contact stack 640. Alternatively, a pulsed laser beam may be provided to form an array or grid of regions (for example dots) on the face of the ohmic contact stack 640 that are laser annealed. Laser annealing may be particularly beneficial when the ohmic contact 640 is formed after the power device 330, so as to avoid the need for high temperature annealing of the ohmic contact. Laser annealing of an ohmic contact for silicon carbide is described in U.S. Application Publication 2005/0104072 to Slater, Jr. et al., entitled "Localized Annealing of Metal-Silicon Carbide Ohmic Contacts and Devices So Formed", the disclosure of which is hereby incorporated herein by reference in its entirety as if set forth fully herein.

The three-layer stack 640 that is illustrated in FIG. 6 may be particularly amenable to the laser annealing process. In particular, an aluminum layer 642 forms a good ohmic contact for p-type silicon carbide layer 120. However, the aluminum may be reflective at thicknesses greater than, for example, about 500 Å, so that the laser beam 610 may reflect off the aluminum and not penetrate to the junction between the p-type silicon carbide epitaxial layer 120 and the aluminum layer 642, and may not form a high quality ohmic contact. However, it has been found that the combination of aluminum 642, titanium 644 and nickel 646 can provide a structure that allows the laser to penetrate through to the junction with the p-type silicon carbide epitaxial layer 120. Without wishing to be bound by any theory of operation, it appears that the aluminum layer 642 may be made sufficiently thin, for example, less than about 500 Å thick, so as to be semitransparent to the laser beam 610, and that the nickel layer 646 can also be made sufficiently thin, for example less than about 500 Å, so as to also be semitransparent to the laser beam 610, while enhancing the quality of the ohmic contact 640. In particular, the laser beam 610 may be absorbed in the nickel layer 646 in addition to the interface between the p-type silicon carbide layer 120 and the aluminum layer 642. This may cause the nickel layer 646 to at least partially melt, which in turn can melt at least part of the lower melting point aluminum layer 642. The intermediate titanium layer 644 can enhance adhesion and corrosion resistance.

In yet other embodiments of the present invention, a single aluminum layer 642 may be used and laser annealed, as was described in connection with FIG. 6. In particular, in some embodiments, a single layer 642 comprising aluminum may be provided having a thickness of about 250 Å, and in some embodiments about 276 Å. Laser annealing may be performed at densities of 4.0J/cm$^2$ to about 2.5J/cm$^2$, with five pulses per area in some embodiments, to produce an ohmic contact. In some embodiments, the lower fluences from about 3.5J/cm$^2$ to about 2.5J/cm$^2$ may produce a better ohmic contact. The contact resistance may be in a similar range as produced by the three-layer Al/Ti/Ni stack 640. Accordingly, some embodiments of the present invention may provide an ohmic contact for p-type silicon carbide layer 120 using a single layer 642 comprising aluminum that is then laser annealed.

It will also be understood by those having skill in the art that embodiments of FIG. 6 may be used for the ohmic contacts 140 embodiments of FIGS. 1C, 2C, 3C, 4C and 5C, and also may be used for the ohmic contacts 140' of FIGS. 1E, 2E, 3E, 4E and 5E, and/or the ohmic contacts 140" of FIGS. 1G, 2G, 3G, 4G or 5G.

As noted above, FIGS. 1A-6 also illustrate silicon carbide power devices according to various embodiments of the present invention. These devices include a p-type silicon carbide epitaxial layer 120, including first and second opposing faces 120a, 120b, respectively. A silicon carbide power device structure 130, 330, 430 or 530 is provided on the second face 120b of the p-type silicon carbide epitaxial layer 120. An ohmic contact 140, 140', 140" or 640 is provided directly on at least a portion of the first face 120a of the p-type silicon carbide epitaxial layer. Some embodiments also include a silicon carbide substrate 110', 110" including at least one via 112 that extends therethrough, so as to expose at least a portion of the first face 120a of the p-type silicon carbide layer, wherein the ohmic contact 140', 140" extends in the at least via and directly on at least a portion of the first face 120a of the p-type silicon carbide layer 120 that is exposed. As also shown in FIG. 6, in some embodiments, the ohmic contact comprises a metal contact including laser annealed portions therein. The metal contact that includes laser annealed portions therein may comprise first, second and third layers 642, 644, 646, as illustrated in FIG. 6, or a single layer 642 as described above.

FIGS. 7A-7E are cross-sectional views of fabrication methods for an n-channel IGBT, and IGBT devices so fabricated, according to detailed embodiments of the present invention, which were generally illustrated in FIGS. 3A-3C. The n-channel IGBT that is formed may use a fabrication process for an n-channel DMOSFET 330 that is described in the above-cited U.S. Pat. Nos. 7,118,970; 7,074,643; 7,026,650; 6,979,863 and 6,956,238.

Figure 7A:
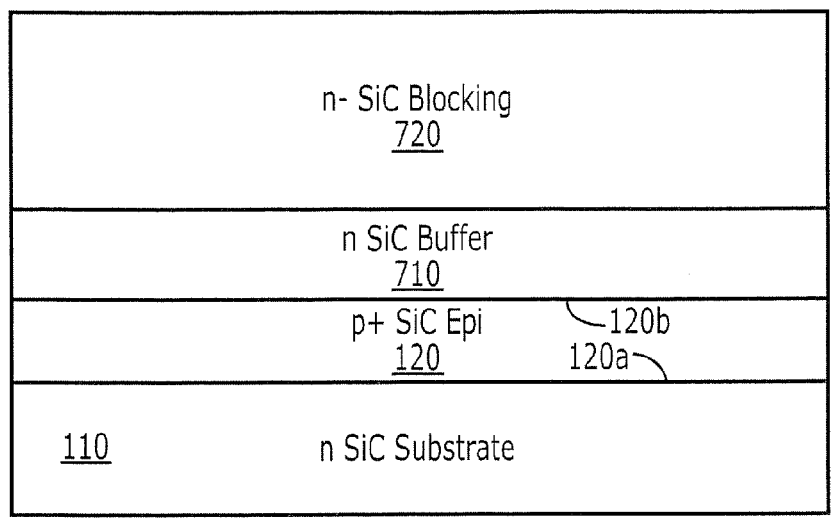
FIGS. 7A-7F are cross-sectional views of n-channel silicon carbide IGBTs according to various embodiments of the present invention during intermediate fabrication steps according to various embodiments of the present invention.

Referring now to FIG. 7A, a p+ silicon carbide epitaxial layer 120, also referred to as a p+ injector layer, may be grown to a thickness of about 15 μm and doped with aluminum at a density of 1E9 cm$^{-3}$. The p+ injector layer 120 may be epitaxially grown on a 4H n-type 8° off-axis low Micro Pipe Density (MPD) silicon carbide substrate 110. An n-type silicon carbide buffer layer 710 may then be grown on the p+ silicon carbide injector 120, to a thickness of about 2 μm and doped with nitrogen at about 4E16 cm$^{-3}$. An n-type silicon carbide blocking layer 720 may then be epitaxially grown on the n-type silicon carbide buffer layer 710 to a thickness of about 120 μm and doped with nitrogen at a level of about 3E14 cm$^{-3}$. The exposed surface of the silicon carbide blocking layer 720 may then be planarized by grinding away about 20 μm of this layer to thin the layer to about 100 μm in thickness and polishing the layer. The resultant n− silicon carbide blocking layer 720 can form the n− drift region of the device.

Figure 7B:
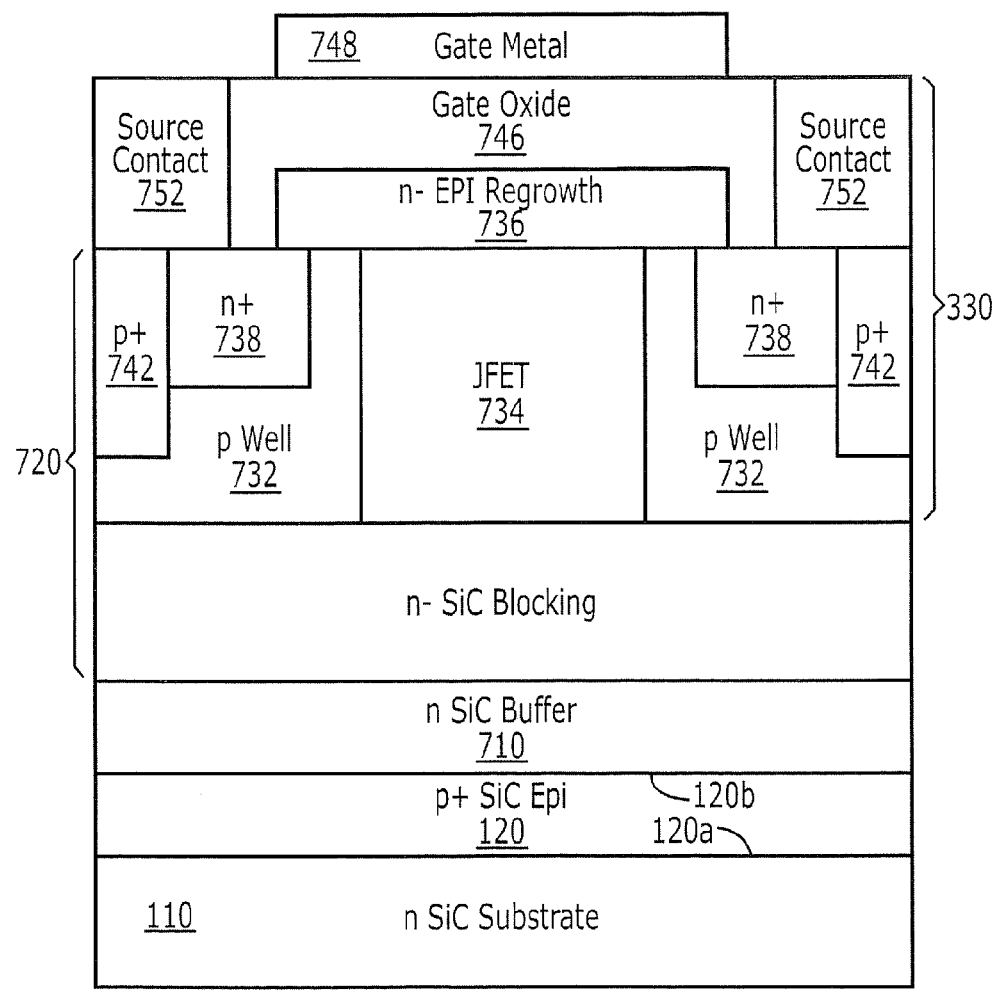

Referring now to FIG. 7B, a silicon carbide n-DMOSFET 330 is then fabricated, for example, as described in the above-cited U.S. Patents. For example, p-wells 732 are implanted, for example using aluminum at a dose of about 5E14 cm$^{-2}$ and a highest energy of 360 keV at a temperature of about 650° C. P− regions are implanted using, for example, boron, at a total dose of about 4.47E13 cm$^{-2}$ and a highest energy of 180 keV at room temperature. A JFET region 734 is then implanted using nitrogen at a total dose of about 4.9E11 cm$^{-2}$ and a highest energy of about 360 keV, at room temperature.

A high temperature implant activation anneal may then be performed at about 1650° C. in argon for about 5 minutes. N−epitaxial regrowth region 736 is then formed, for example, by performing epitaxial growth in nitrogen for a thickness of about 1200 Å and a dose of about 1E16 cm$^{-3}$. N+ source regions 738 are then formed, for example, in nitrogen at a total dose of about 2E15 cm$^{-2}$ and a highest energy of about 130 keV, at about 650° C. P+ body regions 742 are then implanted, for example, using aluminum at a total dose of 8.2E14 cm$^{-2}$ and a highest energy of about 300 keV, at about 650° C. The regrown layer 736 may then be etched to provide a mesa, as illustrated. N+ channel stop implantations may then performed using nitrogen at a total dose of about 2E14 cm$^{-2}$ and a highest energy of about 180 keV, at room temperature. A high temperature implant activation anneal may then be performed about 1650° C. for about 5 minutes in argon. Field oxide may then be deposited, for example, using high temperature oxide at a thickness of about 8000 Å. Gate oxide 746 is then grown, for example, under the following parameters: 1175° C. Dry $O_2$ 3:30 hr., 1175° C. Ar 1 hr, 950° C. Wet $O_2$ 3 hr., 1175° C. NO 2 hr. Gate metal is then deposited, for example, using about 4000 Å of polysilicon doped with boron. Metallization may then be performed to form gate metal 748, for example, using Al/Ni at a thickness of about 150 Å/400 Å and n ohmic metallization may then be performed to form the source contact 752, for example, using about 500 Å of nickel. An ohmic contact anneal may then be performed at about 825° C. in argon for about 2 minutes in a rapid thermal annealing furnace. Overlayer metal deposition (not shown) may then take place using, for example, about 4 μm of aluminum. A spin-on scratch coating (not shown) of about 8 μm of polyimide may then be applied. It will be understood that the steps described in connection with FIG. 7B are well known to those having skill in the art of fabrication of an n-DMOSFET device, and may be varied considerably depending upon the design objective and/or other features to be included in the design.

Figure 7C:
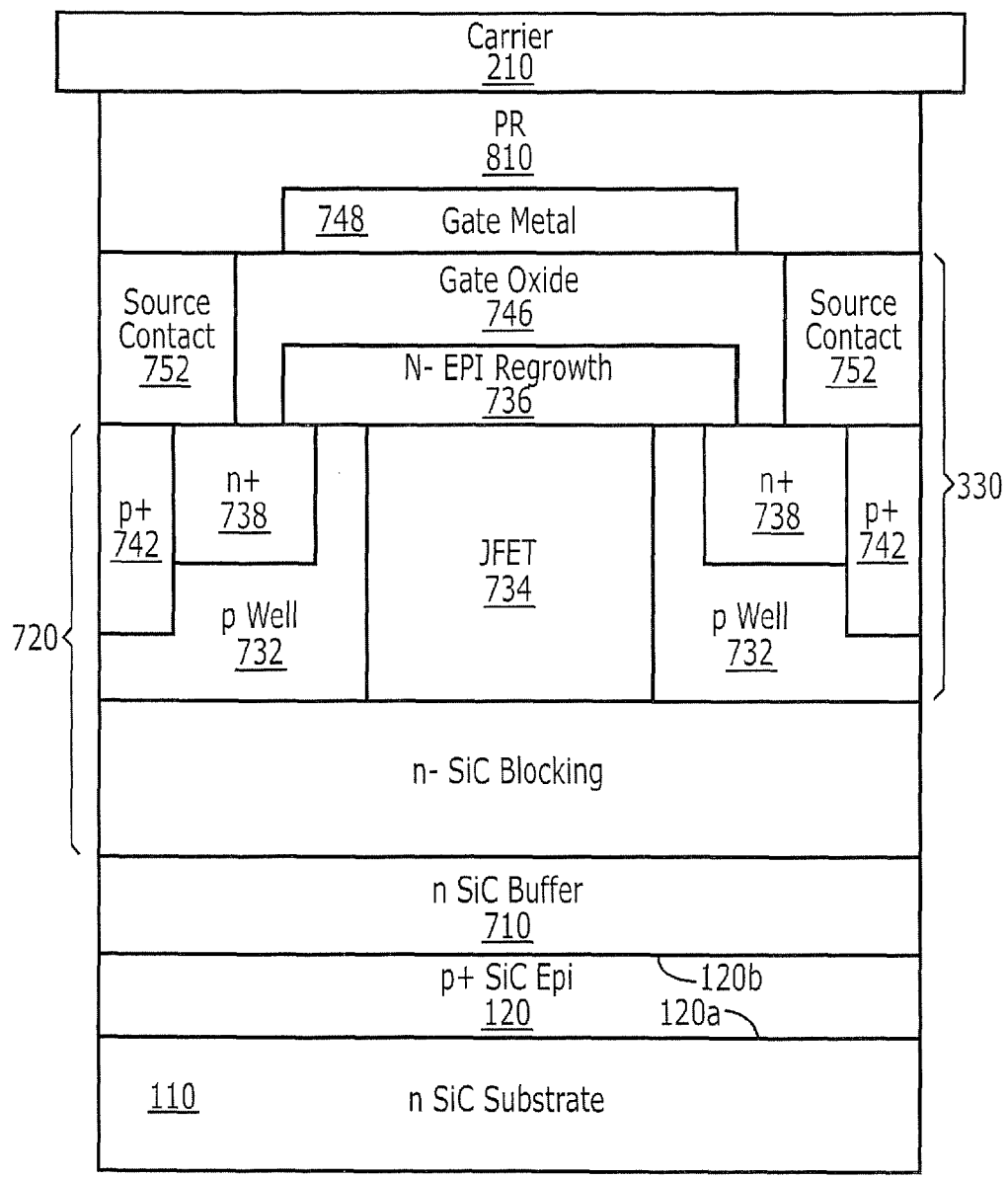

Referring now to FIG. 7C, a protective layer of, for example, photoresist 810 and/or other protective material may then be applied, and the structure may then be bonded to a carrier wafer 210 for support.

Figure 7D:
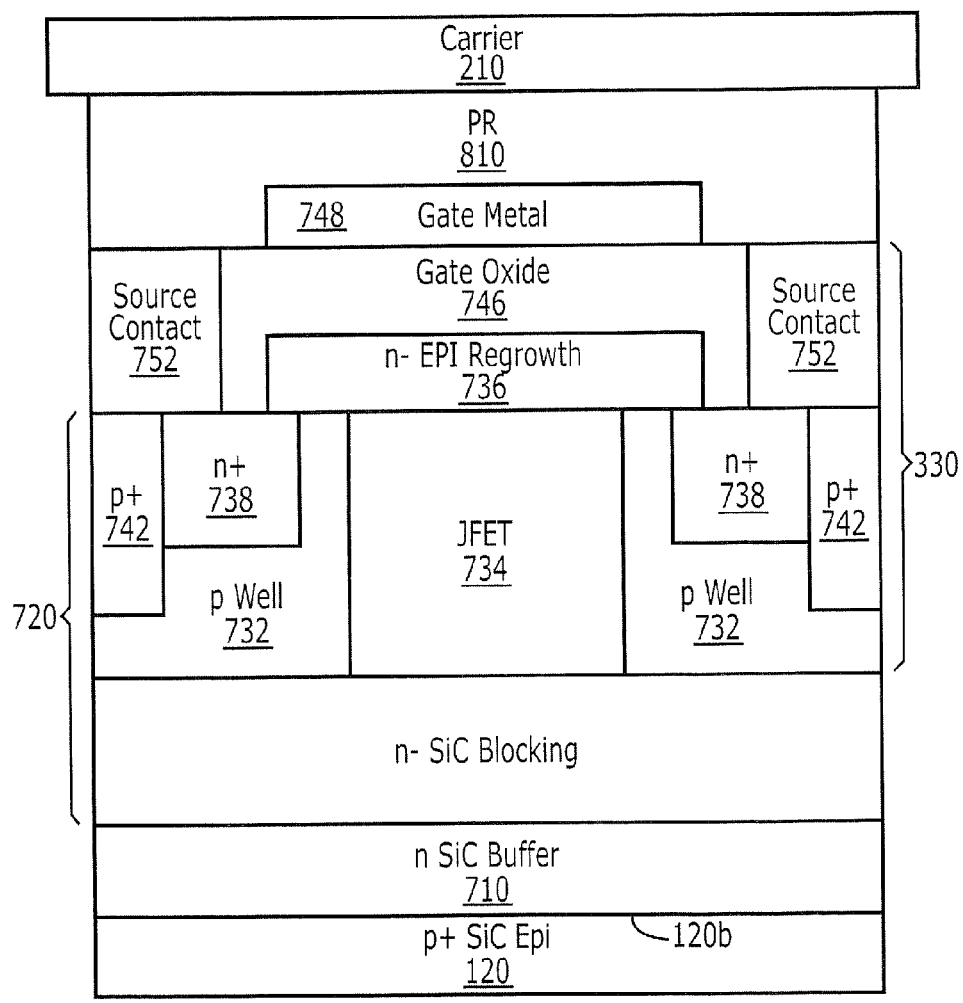

Referring now to FIG. 7D, the n silicon carbide substrate 110 is ground down to expose the first face 120a of the p+ silicon carbide epitaxial layer 120.

Figure 7E:
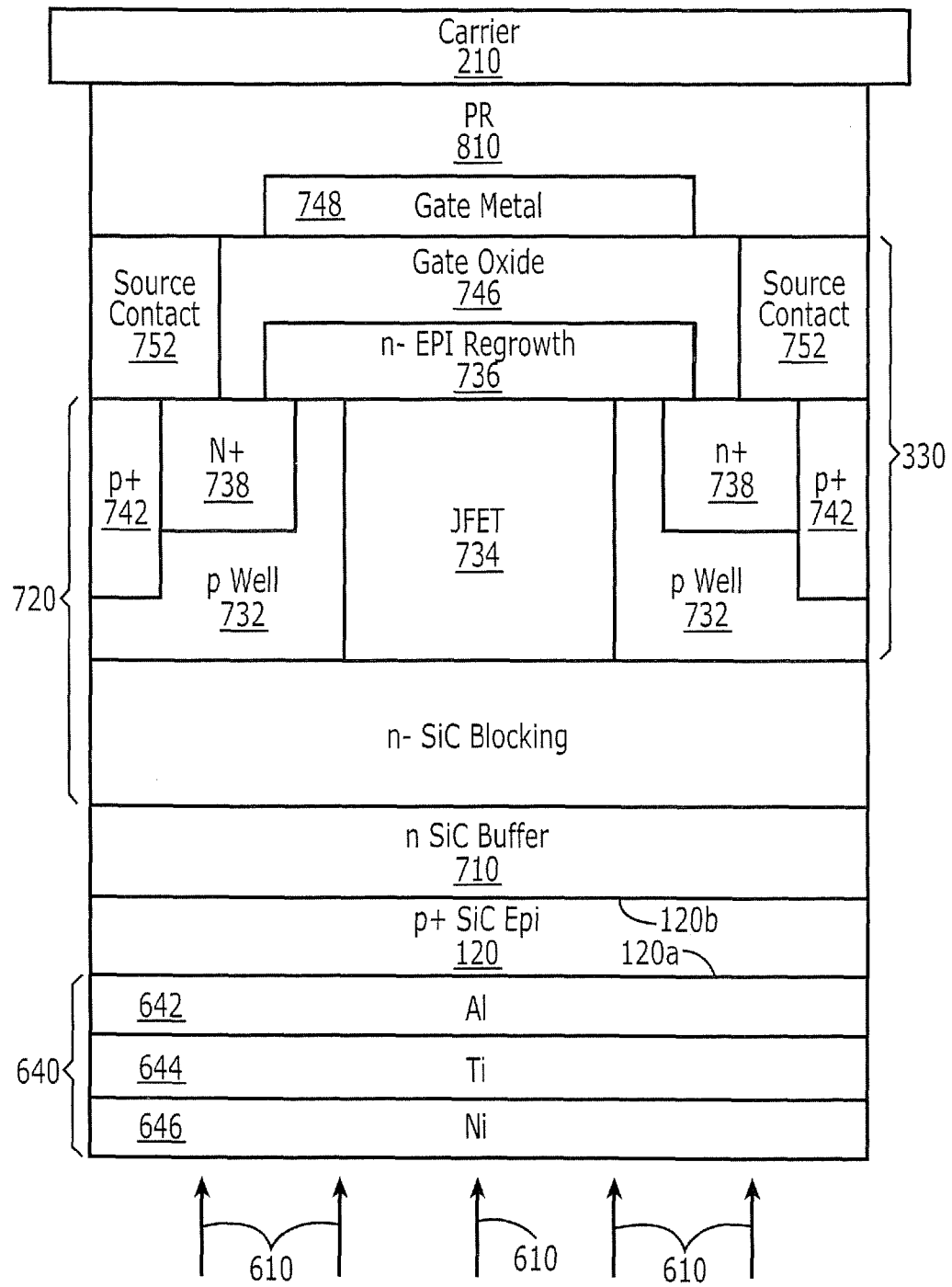

Then, referring to FIG. 7E, an ohmic contact 640 is formed on the first face 120a of the p+ silicon carbide epitaxial layer 120. As was described in connection with FIG. 6, the ohmic contact 640 may include a first layer 642 comprising aluminum at about 200 Å in thickness, a second layer 644 comprising titanium at about 100 Å in thickness, and a third layer 646 comprising nickel at about 400 Å thickness. A laser anneal 610 is then performed as was described above. Back side overlayer metallization also may be performed by adding about 1000 Å of titanium, about 500 Å of platinum and about 9000 Å of gold (not shown).

Figure 7F:
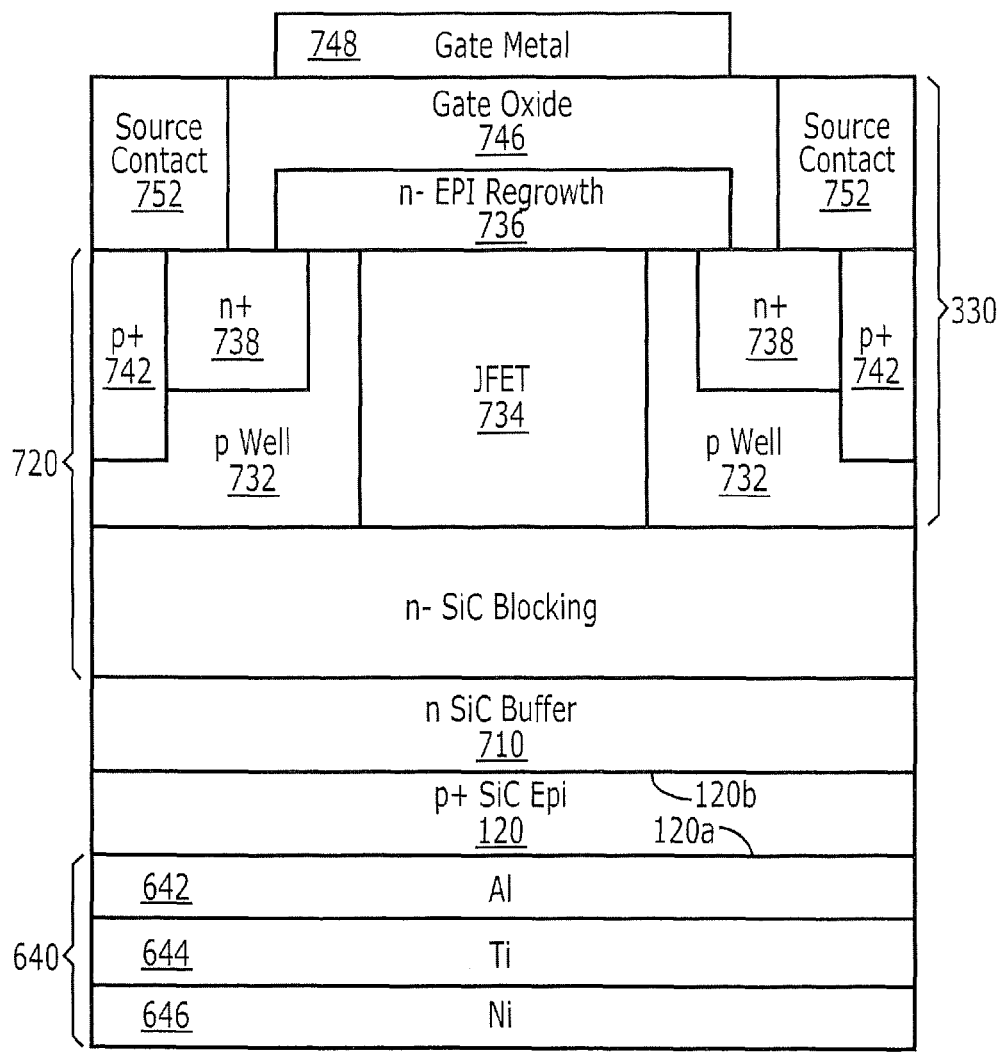

Finally, as shown in FIG. 7F, the structure is debonded from the carrier wafer, and the layer of photoresist 810 and/or other bonding layers may be removed.

Additional discussion of various embodiments of the present invention will now be provided. In particular, because the on-resistance of a unipolar power device generally increases by the square of the blocking voltage, a technology switch to bipolar devices may be desirable at very high blocking voltages. For silicon carbide devices, this transition point generally occurs at about 10 kV when considering both conduction and switching losses. A unipolar n-channel DMOSFET structure becomes bipolar when the substrate is switched from n-type to p-type. This p-n junction is forward biased in the on-state and injects minority carriers into the lightly doped blocking layer to increase its conductivity, a phenomenon known as conductivity modulation. Unfortunately, 4H SiC p-type substrates generally lack both quality and conductivity to work in this regard. Hence, a p-channel IGBT, fabricated on 4H silicon carbide n-type substrate has been developed, as described, for example, in U.S. Provisional Application Ser. No. 60/817,296, filed Jun. 29, 2006, entitled "Silicon Carbide Switching Devices Including P-Type Channels and Methods of Forming the Same", the disclosure of which is hereby incorporated herein by reference in its entirety as if set forth fully herein.

Conventional n-channel silicon IGBTs generally are not viable above the about 10 kV range, where silicon carbide devices operate, due to silicon material limitations. Moreover, conventional n-channel silicon carbide DMOSFETs may suffer from extensive conduction losses above about 10 kV blocking voltage due to its unipolar nature.

In contrast, according to some embodiments of the present invention, n-channel IGBTs may be provided by reducing or eliminating the above-described issues with the p-type substrate. Rather, conventional n− drift/buffer layers are grown on a p+ epilayer. The substrate may be removed by grinding, wherein the grinding process can stop on the p+ epilayer. Back side ohmic contacts may be made by laser annealing before overlayer deposition.

Figure 8B:
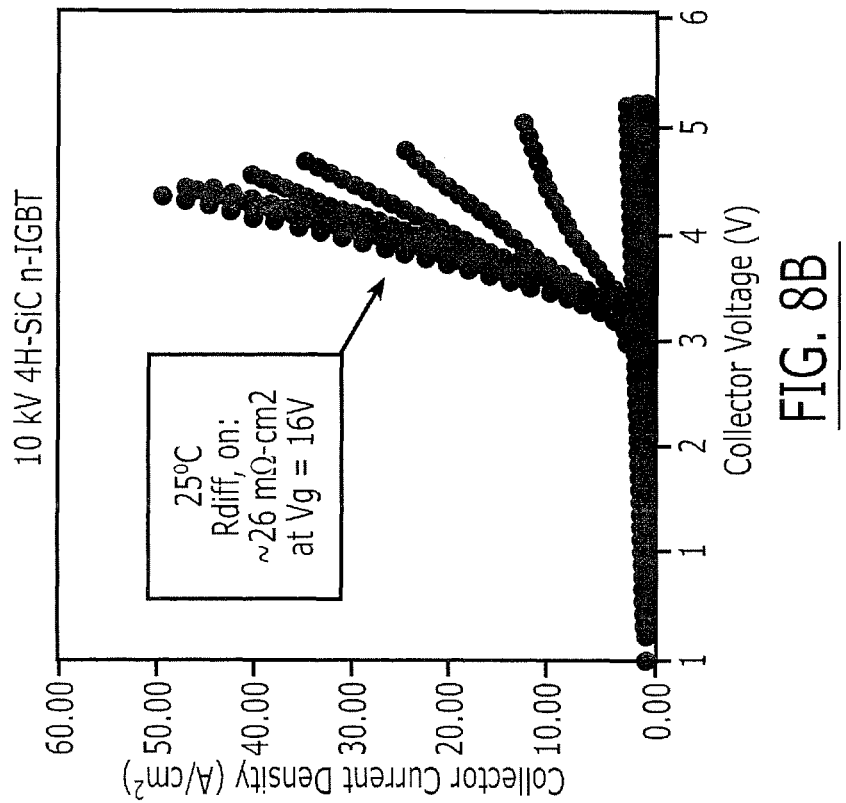
FIGS. 8A and 8B graphically illustrate a comparison of 4H silicon carbide p- and n-channel IGBT turn on characteristics according to various embodiments of the present invention.
Figure 8A:
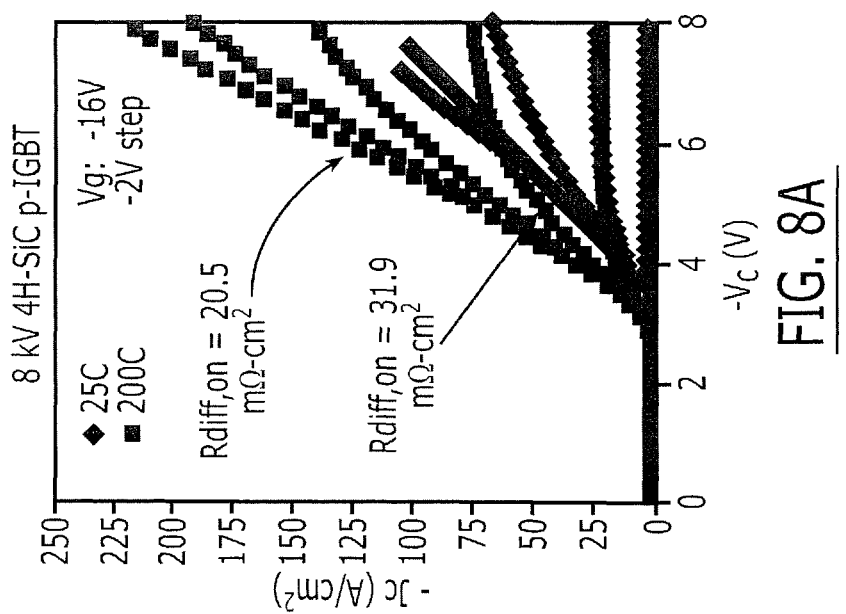
Figure 9:
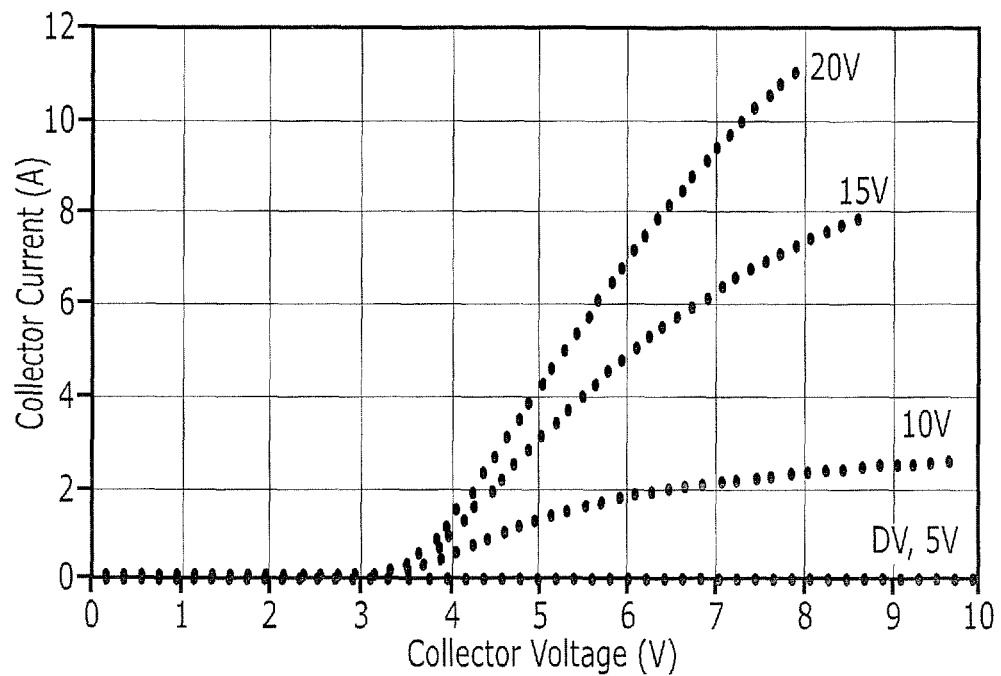
FIGS. 9 and 10 graphically illustrate forward conduction and forward blocking, respectively, of an n-channel silicon carbide IGBT according to various embodiments of the present invention.
Figure 10:
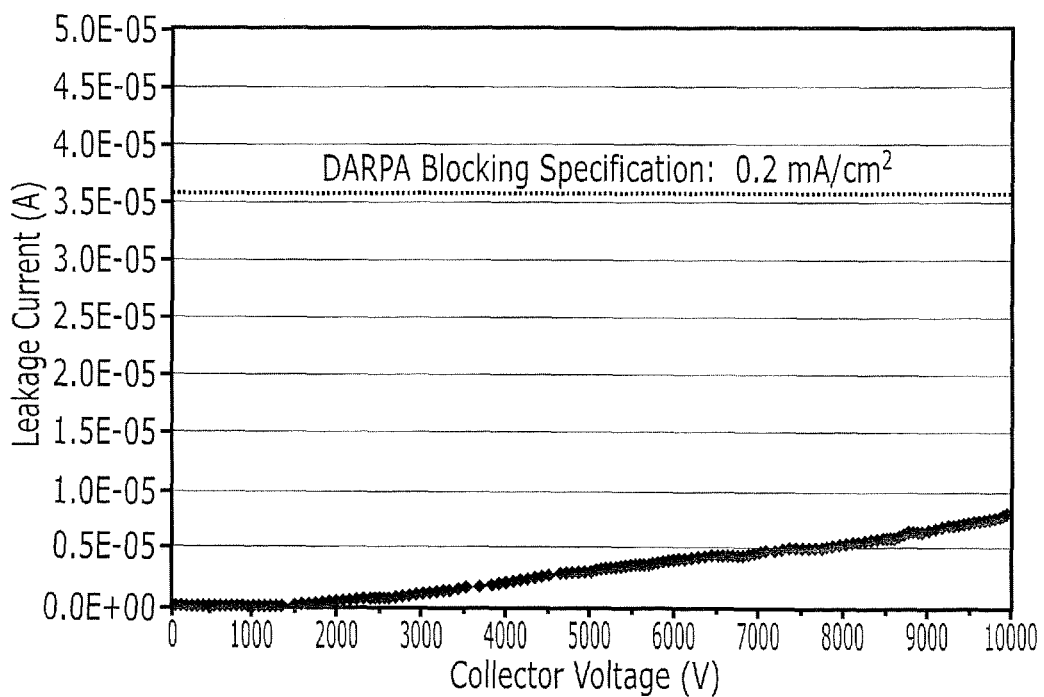
Figure 11:
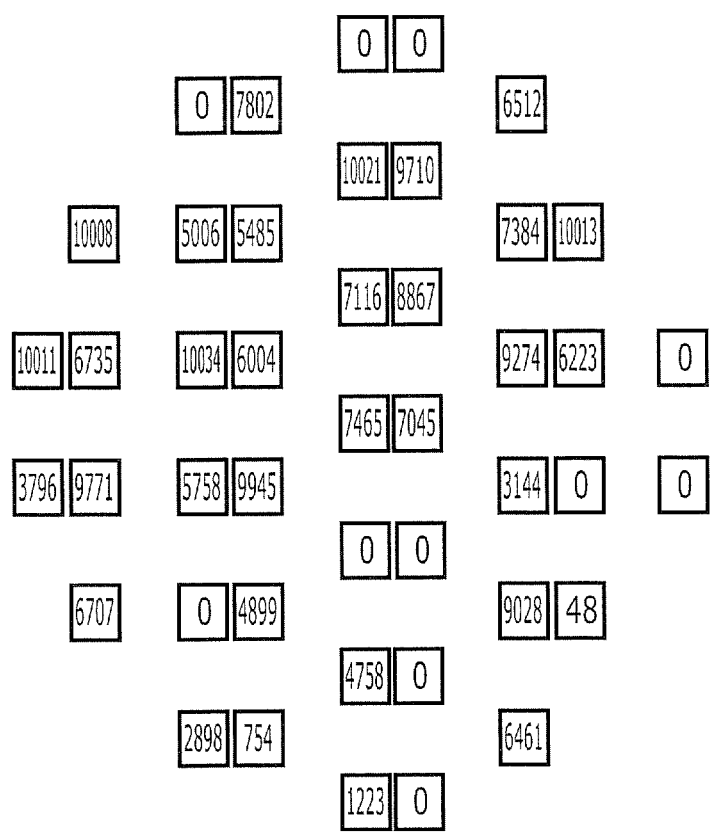
FIG. 11 illustrates yields for an IGBT wafer according to various embodiments of the present invention.

P-channel silicon carbide IGBTs may be compared with n-channel silicon carbide IGBTs according to some embodiments of the present invention. FIGS. 8A and 8B compare 4H silicon carbide p-channel IGBT and n-channel IGBT turn on characteristics. As shown in FIG. 8B, the n-channel IGBT demonstrates lower differential on-resistance and full 10 kV blocking as a result of benefiting from the mature 4H SiC DMOSFET technology. Thus, lower on resistance and higher blocking voltage may be provided by an n-channel SiC IGBT according to some embodiments of the present invention compared to its p-channel counterpart, because the technology is derived from a mature SiC n-channel MOSFET process. The conduction and blocking characteristics of n-channel IGBTs are illustrated in FIGS. 9 and 10. FIG. 9 illustrates forward conduction of large area n-IGBTs capable of carrying 4 amperes at a threshold voltage of 5 volts. FIG. 10 illustrates the forward blocking voltage of the same device of FIG. 9, showing low leakage current at the 10 kV blocking voltage. The n-channel legacy also results in good wafer yield, as shown in FIG. 11, wherein the squares labeled 10008, 10011, 10021, 10034, 10013, 9771, 9945, 8004, 9710, 8867, 9274 and 9028 provide 10 kV capable devices with a 27% blocking yield. Moreover, the n-channel devices, with their positive voltage polarities and similarities to conventional power MOSFETs may be more attractive from a systems point of view. It will also be understood that FIGS. 7A-7F illustrate n-channel IGBTs. However, other devices that use a p-type silicon carbide epitaxial layer may benefit from methods and structures according to embodiments of the present invention.

Accordingly, some embodiments of the invention use the "wrong polarity" substrate as a platform to fabricate devices of high quality. The "wrong polarity" substrate is then at least partially removed to reduce or eliminate its effect.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A silicon carbide power device comprising:
   a p-type silicon carbide epitaxial layer including first and second opposing faces;
   a silicon carbide power device structure on the second face of the p-type silicon carbide epitaxial layer; and
   an ohmic contact directly on at least a portion of the first face of the p-type silicon carbide epitaxial layer.

2. A device according to claim 1, further comprising:
   an n-type silicon carbide substrate on the first face, including at least one via that extends therethrough so as to expose at least the portion of the first face of the p-type silicon carbide epitaxial layer;
   wherein the ohmic contact extends in the at least one via and directly on at least the portion of the first face of the p-type silicon carbide epitaxial layer that is exposed.

3. A device according to claim 1, wherein the ohmic contact comprises a metal contact.

4. A device according to claim 3, wherein the metal contact includes laser annealed portions therein.

5. A device according to claim 4, wherein the metal contact that includes laser annealed portions therein comprises a first layer comprising aluminum directly on the first face of the p-type silicon carbide epitaxial layer, a second layer comprising titanium on the first layer and a third layer comprising nickel on the second layer.

6. A device according to claim 4, wherein the metal contact that includes laser annealed portions therein comprises a layer comprising aluminum directly on the first face of the p-type silicon carbide epitaxial layer.

7. A device according to claim 1, wherein the silicon carbide power device structure comprises an n-channel silicon carbide DMOSFET structure directly on the second face of the p-type silicon carbide epitaxial layer, such that the n-channel silicon carbide DMOSFET structure and the p-type silicon carbide epitaxial layer provide an n-channel silicon carbide IGBT structure.

8. A device according to claim 7, wherein the silicon carbide power device structure comprises a p-type silicon carbide power device structure on the p-type silicon carbide epitaxial layer.

9. A device according to claim 7, further comprising:
   an n-type silicon carbide substrate on the first face, including at least one via that extends therethrough so as to expose at least the portion of the first face of the p-type silicon carbide epitaxial layer;
   wherein the ohmic contact extends in the at least one via and directly on at least the portion of the first face of the p-type silicon carbide epitaxial layer that is exposed.

10. A device according to claim 7, wherein the ohmic contact comprises a metal contact.

11. A device according to claim 10, wherein the metal contact includes laser annealed portions therein.

12. A device according to claim 11, wherein the metal contact that includes laser annealed portions therein comprises a first layer comprising aluminum directly on the first face of the p-type silicon carbide epitaxial layer, a second layer comprising titanium on the first layer and a third layer comprising nickel on the second layer.

13. A device according to claim 11, wherein the metal contact that includes laser annealed portions therein comprises a layer comprising aluminum directly on the first face of the p-type silicon carbide epitaxial layer.

14. A device according to claim 1, wherein the silicon carbide power device structure comprises an n-type silicon carbide epitaxial layer directly on the second face of the p-type silicon carbide epitaxial layer so as to form a p-n junction therebetween.

* * * * *

UNITED STATES PATENT AND TRADEMARK OFFICE
CERTIFICATE OF CORRECTION

| | | |
|---|---|---|
| PATENT NO. | : 8,866,150 B2 | Page 1 of 1 |
| APPLICATION NO. | : 11/756020 | |
| DATED | : October 21, 2014 | |
| INVENTOR(S) | : Das et al. | |

It is certified that error appears in the above-identified patent and that said Letters Patent is hereby corrected as shown below:

In the Claims:
Column 14, Claim 8, Line 4: Please correct "according to claim 7,"
                                  to read -- according to claim 2, --

Signed and Sealed this
Tenth Day of March, 2015

Michelle K. Lee
*Deputy Director of the United States Patent and Trademark Office*